United States Patent
Katsumura et al.

[11] Patent Number: 5,925,444
[45] Date of Patent: Jul. 20, 1999

[54] ORGANIC BINDER FOR SHAPING CERAMIC, ITS PRODUCTION METHOD AND PRODUCT EMPLOYING THE SAME

[75] Inventors: Nobuhito Katsumura; Fusaji Shoji; Madoka Kinoshita, all of Yokohama; Shousaku Ishihara, Chigasaki; Tsuyoshi Fujita, Yokohama, all of Japan

[73] Assignee: Hitachi, Ltd., Tokyo, Japan

[21] Appl. No.: 08/606,238

[22] Filed: Feb. 23, 1996

Related U.S. Application Data

[63] Continuation of application No. 08/164,448, Dec. 9, 1993, abandoned.

[30] Foreign Application Priority Data

Dec. 9, 1992 [JP] Japan ..................................... 4-329431

[51] Int. Cl.⁶ ..................................................... B32B 3/00
[52] U.S. Cl. .......................... 428/209; 428/325; 428/500; 428/522; 428/901
[58] Field of Search ..................................... 524/457, 458, 524/502; 428/209, 325, 522, 500, 901

[56] References Cited

U.S. PATENT DOCUMENTS

| | | | |
|---|---|---|---|
| Re. 34,887 | 3/1995 | Ushifusa et al. | 361/795 |
| 4,551,357 | 11/1985 | Takeuchi | 427/96 |
| 4,613,560 | 9/1986 | Dueber et al. | 430/286 |
| 4,795,512 | 3/1989 | Nakatani et al. | 156/89 |
| 4,863,683 | 9/1989 | Nakatani et al. | 419/10 |
| 4,868,238 | 9/1989 | Craig | 524/457 |
| 5,034,451 | 7/1991 | Tanaka et al. | 524/557 |
| 5,080,958 | 1/1992 | Patterson et al. | 428/209 |
| 5,086,093 | 2/1992 | Miller | 524/28 |
| 5,091,033 | 2/1992 | Nakubayashi et al. | 156/316 |
| 5,230,846 | 7/1993 | Tamhankar et al. | 264/61 |
| 5,274,024 | 12/1993 | Koyama et al. | 524/502 X |
| 5,314,850 | 5/1994 | Miyahara | 501/96 |
| 5,328,770 | 7/1994 | Yoshida et al. | 524/502 X |
| 5,362,791 | 11/1994 | Ebenhoech et al. | 524/502 X |

FOREIGN PATENT DOCUMENTS

| | | |
|---|---|---|
| 0005598 | 1/1979 | Japan ..................................... 524/502 |
| 56-76405 | 11/1979 | Japan . |
| 59-155413 | 2/1983 | Japan . |
| 59-995 | 1/1984 | Japan . |
| 59-128266 | 7/1984 | Japan . |
| 59-156959 | 9/1984 | Japan . |
| 60-180955 | 9/1985 | Japan . |
| 60-180956 | 9/1985 | Japan . |
| 60-254697 | 12/1985 | Japan . |
| 61-151060 | 7/1986 | Japan . |
| 1-29408 | 7/1987 | Japan . |
| 63-260855 | 10/1988 | Japan . |
| 1-286955 | 11/1988 | Japan . |
| 1-44668 | 9/1989 | Japan . |
| 3-131604 | 10/1989 | Japan . |
| 1-53233 | 11/1989 | Japan . |

OTHER PUBLICATIONS

Nilsen et al, "Dispersion of Laser—Synthesized $Si_3N_4$ Powder in Non Aqueous Systems", Advances in Ceramics, Vol. 21: Ceramic Powder Science, 1987 pp. 537–547.

*Primary Examiner*—Judy M. Reddick
*Attorney, Agent, or Firm*—Antonelli, Terry, Stout & Kraus, LLP

[57] ABSTRACT

A multilayer ceramic substrate comprising at least one ceramic layer made by laminating at least one ceramic green sheet layer and conductor layers formed on surfaces of the at least one ceramic green sheet layer into laminates and by sintering the resulting laminates. Each ceramic green sheet layer comprises a ceramic precursor composition comprising (I) 100 parts by weight of ceramic fine powder having an average particle diameter of 10 microns or less as component (C) and (II) 5 to 30 parts by weight, based on 100 parts by weight of the ceramic fine powder, of an organic binder for bonding the ceramic fine powder. The organic binder comprises (i) 100 parts by weight of a water insoluble polymer of at least one vinyl monomer as a major component of the organic binder, as component (A), and (ii) 1 to 9.5 parts by weight, based on 100 parts by weight of the component (A), of water soluble polymer as component (B). In the binder particles of the component (A) being dispersed by the component (B) in an aqueous medium resulting from suspension polymerization of the at least one vinyl monomer in water containing the water soluble polymer as a dispersion stabilizer.

4 Claims, No Drawings

ORGANIC BINDER FOR SHAPING CERAMIC, ITS PRODUCTION METHOD AND PRODUCT EMPLOYING THE SAME

This application is a Continuation application of application Ser. No. 08/164,448, filed Dec. 9, 1993 now abandoned.

BACKGROUND OF THE INVENTION

The present invention relates to an organic binder for shaping ceramic used to produce the shaped product, namely green sheet consisting of ceramic precursor when shaping so called ceramic including alumina from the viewpoint of low pollution, resource saving and safety; it related especially to the organic binder for shaping ceramic of water system excellent in removability of binder, its production method and product employing the same.

(i) Conventionally, such an organic binder as butylal resin and acrylic acid ester is generally used as ceramic binder. This binder is dissolved or dispersed in such organic solvent as alcohol, ketone, chloride system solvent, aromatic solvent, is mixed with fine ceramic powder, and is kneaded by the ball mill or similar means for a long time to be made into a slip form. After being degassed, this is cast into sheets having a specified thickness by the doctor blade method or reverse quarter method, and heated and dried on such a material as polyester film to be made into green sheets.

(ii) Regarding the ceramic water-soluble binder, the watersoluble polyvinyl acetal having an acetalization degree of 10 mol percent or less is disclosed in the Japanese Patent Application Laid-open NO. 56-76405, and the cold water soluble polyvinyl acetal having an acetalization degree of 10 to 30 mol percent or less is disclosed in the Japanese Patent Application Laid-open NO. 1-29408-1989, while the denaturated polyvinyl alcohol (PVA) having the side chain of hydrophobic group or specific ionic hydrophilic group uses as water system organic binder is disclosed in the Japanese Patent Application Laid-open NO. 59-156959.

(iii) The water soluble acrylic acid ester system binder is disclosed in the Japanese Official Patent Gazette 1-53233, the Japanese Official Patent Gazette 1-44668 and the Japanese Patent Application Laid-open NO. 1-286955. Ammonia, trialkylamine such as trimethylamine, and amine such as dimethylamine alcohol, monoethanolamine are added to the methacrylic acid ester or acrylic acid ester copolymer having the carboxyl group (hereinafter referred to as "(meth) acrylic acid copolymer") -the (meth)acrylic acid ester copolymer consisting of copolymerized (meth)acrylic acid—thereby achieving neutralization (pH adjustment).

(iv) Emulsion binders which are produced by emulsification and polymerization of vinyl monomer by the surfactant and which are neutralized (pH-adjusted) by ammonia using the (meth)acrylic acid are disclosed in Japanese Patent Application Laid-open NO. 60-180955, Japanese Patent Application Laid-open NO. 60-180956, Japanese Patent Application Laid-open NO. 61-151060 and Japanese Patent Application Laid-open NO. 1-286955, while those having crosslinking structure are disclosed in the Japanese Patent Application Laid-open NO. 63-260855.

(v) The Japanese Patent Application Laid-open NO. 3-131604 discloses the swollen substance comprising (a) alpha-olefin polymer, (b) single (meth)acrylic acid or (meth)acrylic acid monomer and stylene monomer, and (c) polymerization initiator is dispersed, for example, in the water system medium containing such a polymerization dispersant as water soluble high polymer polyvinyl alcohol and is subjected to suspension polymerization to be formed into the binder.

(vi) The Japanese Patent Application Laid-open NO. 59-128266 discloses the complex organic binder for shaping ceramic containing 1 to 1,000 parts by weight of hydrophobic high polymer (a) for 100 parts by weight of the water soluble high polymer.

On the other hand, (vii) the Japanese Patent Application Laidopen NO. 59-995 and Japanese Patent Application Laid-open NO. 60-254697 disclose the ceramic circuit board production method, where polymethyl methacrylate resin and polymethacrylic acid ester resin as the binding including the pyrolytic polymer type resin are disclosed.

For the binder mentioned in said (i), however, butyl alcohol, isopropyl alcohol, trichloroethylene, toluene, etc. are used as organic solvent. However, they have problems in explosiveness by ignition, hazard of causing fire, and offensive odor in molding and drying—especially, the halogen system solvent involving such pollution problems as environmental pollution by evaporative gas and hazards to human bodies; solution of these problems requires installation of an explosion proof device, exhaust treatment equipment and solvent recovery equipment.

The cases of said (ii) and (iii) have the disadvantage that characteristics of the ceramic green sheet are subjected to variation because water soluble has a great hygroscopicity. The case of said (iv) has the disadvantage that the ceramic green sheet using emulsion having carboxyl group features a weak tensile strength and is inferior in glossiness and flatness.

Furthermore, all binders involve such problems as inferior removability of binders and inferior strength of the ceramic sheet and ceramic circuit board after firing.

The case of said (v) features poor mutual solubility between components (a) and (b) is poor and inferior mechanical characteristics of the ceramic precursor composition. Use of polymers featuring poor thermal decomposition such as alphaolefin polymer and polyvinyl alcohol involves such problems as inferior removability of binders and inferior strength of the ceramic, ceramic sheet and ceramic circuit board after firing.

The case of said (vi) provides a method by which hydrophobic high polymer latex produced as water system dispersion substance by emulsification and polymerization is dissolved in water soluble high polymer solution. Since the water soluble high polymer contains a great deal of high polymers featuring poor thermal decomposition, it is important to minimize the amount to be added if the water soluble high polymer is to be used as binder. Presence of a great deal of water soluble high polymers will cause the green sheet to absorb moisture, resulting in increased variations of mechanical characteristics. Furthermore, hydrophobic high polymer latex generated by emulsification and polymerization contains much surfactant; this means a poor workability since it may cause coagulation depending on the type of ceramic powder, and cause foams to be produced during degassing.

On the other hand, when the polymethylmethacrylate resin and polymethacrylic acid ester resin used in (vii) are to be used as organic binder for shaping ceramic, it provides a method of producing the green sheet having a uniform thickness from the slip composed, for example, of ketone solution such as methylethylketone, alcohol solvent such as butyl alcohol, plasticizer, and ceramic powder by the doctor blade method. In this case, all solvents have high steam pressure, and safety against fire is inferior. To ensure safety against fire, conventional techniques have depended on a combined use of halogen solvent, involving environmental pollution problems.

SUMMARY OF THE INVENTION

The object of the present invention is to provided an organic binder for shaping ceramic which will solve these problems involved in the conventional techniques, will improve such characteristics of the green sheet as flexibility, shapability, dispersive power, surface states, mechanical strength by the application of the present invention, will improve such characteristics as compactness, surface flatness, laminated pressure bondability and mechanical strength of the multilayer ceramic substrate gained by lamination and firing of said green sheet, and will ensure a low pollution and resource saving; another object of the present invention is to provide a method of producing said organic binder; and a still another object is to provide the ceramic precursor, ceramic, ceramic green sheet, ceramic sheet, multilayer ceramic substrate which have excellent characteristics and are obtained by using said organic binder.

In an attempt to achieve said objects, the present inventors have made strenuous efforts to find out that the organic binder for shaping ceramic obtained by suspension polymerization using the water soluble high polymer as dispersion stabilizer for polymerization has an excellent removability of binders and is effective as a water system organic binder for shaping ceramic, thereby completing the present invention.

The present invention achieves said objects by means of the organic binder for shaping ceramic characterized in that component (A) is subjected to suspension polymerization in the presence of the polymerization initiator in the water containing 100 parts by weight of dissolved component (A) comprising of one or more types of methacrylic acid esters (the alkyl group having 1 to 18 carbons or the ring alkyl group or aryl group ester having 1 to 12 carbons) and 1 to 9.5 parts by weight of dissolved component (B) comprising water soluble high polymer [for 100 parts by weight of component (A)], or in the mixture between water and water soluble organic solvent.

The ceramic powder as component (C) is not specifically limited, but the average particle size of the ceramic powder, when turned into green sheet, should preferably be 50.0 microns or less. The specified shaped product is obtained from the ceramic precursor composition slurry comprising the 100 parts by weight of ceramic powder as component C, 5 to 30 parts by weight of said organic binder for shaping ceramic as component (D) and, whenever required, the dispersant and plasticizer as component (E).

The green sheet is obtained by coating on the substrate a thin film of the ceramic precursor composition slurry comprising the 100 parts by weight of ceramic powder as component (C) having an average particle size of 50.0 microns or less, 5 to 30 parts by weight of said organic binder for shaping ceramic as component (D) and, whenever required, the dispersant and plasticizer as component (E), thereby achieving said object.

The ceramic green sheet layer is composed of the ceramic precursor composition slurry comprising the 100 parts by weight of ceramic powder as component (C) having an average particle size of 50.0 microns or less, 5 to 30 parts by weight of said organic binder for shaping ceramic as component (D) and, whenever required, the dispersant and plasticizer as component (E); on which conductor layers are formed patternlike and the 5–60 green sheet layers with conductor layers are laminated and bonded, and sintered (in the binder removing process, then in the residual carbon reducing process), thereby producing multilayer ceramic substrates.

Furthermore, the green sheet layer is composed of the ceramic precursor composition slurry comprising the 100 parts by weight of ceramic powder as component (C) having an average particle size of 10.0 microns or less, 5 to 30 parts by weight of said organic binder for shaping ceramic as component (D) and, whenever required, the dispersant and plasticizer as component (E); and said object can be achieved by the method of producing the multilayer wiring ceramic substrate formed by sintering the laminate having conductor layers through two or more of said green sheet layers. When used as such IC substrates, the average particle size of the ceramic powder is more preferably 10 microns or less.

DETAILED DESCRIPTION OF THE INVENTION

The following describes the details of the present invention:

The present invention relates to the organic binder for shaping ceramic and its production method characterized in that component (A) is subjected to suspension (co) polymerization in the presence of the polymerization initiator in the water or in the mixture between water and water soluble organic solvent, containing 100 parts by weight of dissolved component (A) comprising one or more types of (meth)acrylic acid esters (the alkyl group having 1 to 18 carbons or the ring alkyl group or aryl group ester having 1 to 12 carbons), and 1 to 9.5 parts by weight of dissolved component (B) comprising water soluble high polymer [for 100 parts by weight of component (A)].

The component (A) used in the present invention is the major component of the organic binder for shaping ceramic, and serves to bind between ceramic powder and ceramic powder. As the component (A) there can be employed methyl (meth) acrylate, ethyl (meth) acrylate, n-propyl (meth)acrylate, isopropyl (meth)acrylate, n-butyl (meth) acrylate, isobutyl (meth)acrylate, n-amyl (meth)acrylate, isoamyl (meth)acrylate, n-hexyl (meth)acrylate, n-octyl (meth)acrylate, isooctyl (meth)acrylate, desyl (meth) acrylate, dodesyl (meth)acrylate, lauryl (meth)acrylate, stearyl (meth)acrylate, cyclohexyl (meth)acrylate, isobornyl (meth)acrylate, phenyl (meth)acrylate, benzyl (meth) acrylate or the like.

Of these components, methacrylic acid ester system, and n-butyl methacrylate, ethyl methacrylate, n-propyl methacrylate, i-propyl methacrylate, n-octyl methacrylate and methyl methacrylate are suitable from the viewpoint of thermal decomposition.

The component (B) used in the present invention is a water soluble high polymer used as a dispersion stabilizer for polymerization when said component (A) is polymerized in the presence of the polymerization initiator. For example, polyethylene oxide, polyvinyl-2-pyrolidone, polyvinyl-2-pyrolidone copolymer, poly(2-oxazoline) system or the like are used. From the viewpoint of thermal decomposition, polyethylene oxide is more preferred. When used as organic binder for ceramic, the average particle size of the polymer (the particle size at the center of the particle size distribution) should be 5 microns or less and more preferably 3.0 microns or less.

To produce the polymer particle size, the polyethylene oxide for the dispersion stabilizer for polymerization should have the viscometric molecular weight from 100,000 to 1,000,000, preferably from 250,000 to 500,000. The amount of component (B) to be used should be 1 to 9.5 parts by weight for 100 parts by weight as the total volume of the monomer. When the amount used is less than 1 part by weight, there is no dispersion. The polymer size will increase, resulting in particle sedimentation. When 9.5 parts by weight are exceeded, the sintered product will have mall strength because of inferior removability of binder if this water soluble high polymer is used as binder. In this case, moreover, the dielectric constant is high beyond practical use. Since component (B) comprises polymer, the external appearance of the green sheet prepared will much flat than the low molecular surfactant is used. In this case, ceramic powder is less likely to drop from the surface and foams are not easily formed in the degassing process, exhibiting excellent workability. When the water soluble high polymer is used, humidity will cause the variation of the mechanical characteristics of the green sheet, resulting in reduced drilling accuracy.

However, the water soluble high polymer having crystallinity like the polyethylene oxide (melting point: over 60° C. to 67° C., viscometric molecular weight: 100,000 to 1,000,000) has a low hygroscopicity; it has been found out that, even if it is mixed with the polymer of component (A) to be used as binder, it is not affected very much by humidity. It has also been found out that the performance of the water system organic binder according to the present invention is equal to or greater than that of the green sheet produced from the organic solvent comprising said component.

It is also possible to use by adding a combination of one or more of hydroxyl (meth)acrylate such as 2-hydroxyethyl (meth)acrylate and 2-hydroxypropyl (meth)acrylate to component (A) in the range of 30 weight percent or less, if so required. If 30 weight percent is exceeded, coagulation will occur among polymer particles dispersed in the suspension during suspension polymerization, resulting in failure in obtaining stable suspension; hence practical use is not possible. In the same way, it is also possible to use by adding a combination of one or more of such ethylene monomer as ethyrene, isobutylene and methacrylonitrile, such styrene monomer as styrene, alphamethylstyrene and such unsaturated diester monomer as maleic acid diester, fumaric acid diester, itaconic acid diester and citraconic diester in the range of 50 weight percent or less, if so required. If 50 weight percent is exceeded, the sintered product is less strong because of poor removability of binder when the ceramic sintered product is produced by using this copolymer as a binder, resulting in higher dielectric constant; hence practical use is not possible. The purpose of copolymerizing said vinyl monomer such as ethylene to component (A) is to ensure improved thermal decomposition and enhanced mechanical properties.

The plasticizer used with the binder is basically not likely to azeotrope wit water or water system solvent, and has an excellent solubility with the polymer gained from vinyl monomer. Examples are phthalic acid ester such as dibutyl phthalate (hereinafter referred to as "DBP"), di-2-ethylhexyl phthalate (DOP), diisonyl phthalate (DINP), diisodesyl phthalate (DIDP), dihexyl phthalate (DHP), di-n-octyl-phthalate (N-DOP), butylbenzyl phthalate (BBP) and ethyl phthalyl ethyl glycolate, such aliphatic ester as di-2-ethylhexyl adipate (DOA) and dibutyl glycol adipate (BXA), such propylene glycol ether as tripropylene glycol methyl ether (TPM), dipropylene glycol-n-butyl ether (DPnB), tripropylene glycol-nbutyl ether (TPnB) and propylene glycol hexyl ether (PPh); of these, DOP, DINP, DIDP, DHP and N-DOP are preferred. The said plasticizer may be added according to each form, and is not placed under particular restriction, so long as the mechanical characteristics of the ceramic precursor composition formed by the use of the organic binder for shaping ceramic are maintained and good handling properties are ensured. Namely, the mechanical properties of the green sheet obtained by changing the amount of the plasticizer to be added can be adjusted by the plasticizer. As a guideline, elongation of about 5 to 25% is required in order to ensure the good handling properties of the green sheet and drilling accuracy. The plasticizer may be added either during the suspension polymerization of vinyl monomer or after polymerization. It is more preferred to add it during polymerization to prevent the polymer particles from bonding with each other.

The solid content of the organic binder should be at most 50 wt %, and at least 15 wt %. When it exceeds 50 wt %, the particle diameter of component (A) becomes too large, and when it is less than 15 wt %, the efficiency of work lowers.

To produce the organic binder for shaping ceramic used in the present invention is, 1 to 9.5 parts by weight of component (B) for the total 100 parts by weight of component (A) comprising the monomer is dissolved in water or or in the mixture between water and water soluble organic solvent. Component (A) is added in this solution in the presence of the polymerization catalyst while being heated and violently agitated; hence polymerization or copolymerization.

Typical solvents used in the present invention are water soluble solvents such as alcohol including water, methanol, ethanol, propanol and isopropanol, ethylene glycol derivatives including ethylene glycol methyl ether, ethylene glycol ethyl ether, and ethylene glycol butyl ether, diethylene glycol derivatives including diethylene glycol methyl ether, diethylene glycol ethyl ether, and diethylene glycol butyl ether, propylene glycol derivatives including propylene glycol methyl ether, propylene glycol ethyl ether, and propylene glycol butyl ether, acetic ether derivatives including methyl acetate and ethyl acetate, lactic ester derivatives including methyl lactate and ethyl lactate. Selection is made from at least one type of water or in the mixture between water and water soluble solvent. It is also possible to add some of the alcohol solvent which is not water soluble.

When water and water soluble solvent are used, the mixing ratio should be 100 to 50 weight percent of water and 0 to 50 weight percent of water soluble solvent, or more preferably 95 to 50 weight percent of water and 5 to 50 weight percent of water soluble solvent.

As polymerization initiator, such azo-compounds as 2, 2'-azobis(isobutyronitrile), and 2, 2'-azobis(isobutyl) baleronitrile, such peroxides as t-butyl hydroperoxide, benzoyl peroxide and t-butyl peroxide, such persulfates as ammonium persulfide and potassium persulfide—these water soluble polymerization initiators can be used without restriction. The preferred amount to be used should be 0.05 to 5 parts by weight for the total amount of monomer, 100 parts by weight. The molecular weight of the binder can be controlled by addition of such chain transfer agents as tertiary-dodecyl mercaptan and thioglycol as required.

This reaction can be performed normally at the temperature of 40 to 90° C., even if it may depend on the type of the polymerization catalyst. High molecular products will be generated at a lower temperature, and low molecular products will be produced at a higher temperature.

The weight average molecular weight of the polymer of the vinyl monomer which is said binder used for the present invention should be 100,000 to 1,000,000, or more preferably, 200,000 to 550,000. Mechanical properties of the green sheet will be insufficient below 100,000, and the fluidity of the binder resin will be reduced over 1,000,000, resulting in insufficient mechanical properties of the green sheet.

The particle diameter of the polymer obtained from the present invention can be measured by an electronic microscope and microtrack technique.

As ceramic powder having an average particle diameter of 50.0 microns or less used in the present invention, at least one type has been selected from among the following; $Al_2O_3$, $SiO_2$, $3Al_2O_3.SiO_2$, $PbO$, $Al_2O_3.MgO$, $B_2O_3$, $CaO$, $BaO$, $ZrO_2$, $ZrO$, $Na_2O$, $P_2O_3$, $K_2O$, $Li_2O$ and so on. To give more concrete examples, it is selected from at least one type of ceramic powder of alumina ($Al_2O_3$), mullite ($3Al_2O_3.2SiO_2$) and cordierite ($2MgO.2Al_2O_3.5SiO_2$) and from at least one type of glass ceramic powder of the borosilicate glasses $SiO_2$-$B_2O_3$-$Na_2O$ system, $SiO_2$-$B_2O_3$-$K_2O$ system, $SiO_2$-$B_2O_3$-$ZnO$ system, and $SiO_2$-$B_2O_3$-$Li_2O$ system. These glasses should preferably be the non-crystalline or crystalline glass ceramics which can be fired at the temperature lower than the melting point of the copper or should preferably have the components where cristobalite are difficult to generate after sintering. The fine particle of this ceramic is used in spherical or pulverized form. When fine through hole drilling is required, the average particle diameter of the ceramic powder for the green sheet should generally be 10 microns or less, or more preferably, 5 microns or less.

Such high dielectric substances as $BaTiO_3$ and highly resistant materials can be listed as ceramic materials used for the present invention; they are not placed under any particular restriction. The examples of the dispersant aid for ceramic include such polyacrylates as ammonium polyacrylate, phosphate ester, polyethylene glycol, polyvinyl-2-pyrolidone and copolymer, glycerol trioleaste (Advances in ceramics, Vol. 21 Ceramic Powder Science PP. 537 to 547, 1987).

The ceramic dispersant aid serves to make mutual coagulation of ceramic power difficult and to facilitate slurry flow. The ceramic dispersant aid is used by adding the ceramic powder to the solution dissolved or dispersed in the solvent (water, water and water soluble solvent). Before it is used, a ball mill is utilized to perform wet mixing for 1 to 5 hours, then a specified amount of the organic binder for shaping ceramic is added. Again the ball mill is used to wet mix this ceramic precursor composition for at least 10 hours.

To produce the ceramic precursor composition used in according to the present invention, ceramic precursor composition comprising the 100 parts by weight of ceramic powder as component (C), 5 to 30 parts by weight of (meth)acryl resin suspension liquid as the binder which is component (D), and, if required, the dispersant as component (E) selected from among many ceramic dispersant aids is wet mixed by the ball mill for at least five hours, to be made into ceramic precursor composition slurry. After passing through the degassing process, it is subjected to extrusion molding, injection molding, doctor blade method, calender roll method and other methods, to be formed into the ceramic precursor composition. Production method is not restricted.

According to the ceramic production method adopted in the present invention, the product is obtained by fired the ceramic precursor composition obtained from said procedure at the temperature of 350 to 1800° C. in the air or non-reducible atmosphere for at least 5 hours.

The following introduces the method of producing the multilayer ceramic substrate used for the present invention:

The ceramic precursor composition comprising the 100 parts by weight of ceramic powder as component (C) having an average particle size of 50.0 microns or less, 5 to 30 parts by weight of (meth)acryl resin suspension liquid as the binder as component (D) and, if required, the dispersant as component (E) selected from among many ceramic dispersants is wet mixed by the ball mill for 5 to 50 hours, to be made the ceramic precursor composition slurry. After passing through the degassing process, it is formed into the green sheet by the doctor blade method or the like at the room temperature or cast temperature. To improve the mechanical properties of the green sheet, it may be dried at 100 to 120° C. for 90 minutes if required. The resulting green sheet of 0.05 to 2 mm thickness is cut off to a specified size (e.g. 10 to 200 mm ×10 to 200 mm square), and through-holes are drilled at the specified positions on the required layer. The through hole diameter is not placed under restriction, but may be as small as 40 microns.

The conductor paste comprising the major component made of one or more of the conductors W (melting point 3410° C.), Mo (melting point 2620° C.), Ag (melting point 961.9° C.). Au (melting point 1064° C.), Pt (melting point 1769° C.), Pd (melting point 1554° C.), Cu (melting point 1083.4° C.), Ni (melting point 1453° C.), etc. is printed at the specified position of the green sheet provided with said holes by means of screen printing. In this way, a specific circuit is formed on the green sheet via the screen mask. Five to sixty of the green sheets provided with circuits are laminated, and are hot pressed and pressure bonded at the temperature of 80 to 150° C. with the pressure of 0.98 MPa to to 29.4 MPa (10 to 300 kg/cm$^2$). The resultant laminate is cut off to get the specified shape and dimensions. Firing temperature differs depending on the type of the said conductor (generally to be fired below the melting point of the conductor); however, the ceramic substrate can be obtained by firing at the temperature of 350 to 1800° C. in the air or non-reducible atmosphere for at least 5 hours.

To produce the multilayer glass ceramic circuit substrate, during the firing process, firing is conducted at the temperature of 350 to 450° C. in the process of temperature rise in the air or nonreducible atmosphere, and further firing is performed at the temperature of 600 to 900° C. for removing the binder. After that, in order to scatter the residual carbon, firing is performed, if required, at the temperature from 900° C. to the temperature below the melting point of the said conductor under the atmosphere of hydrogen ($H_2$) and water vapor ($H_2O$) at the volume ratio of $10^{-7}$ to $10^{-4}$ or the water vapor (inert atmosphere controled the water vapor pressure in the range of 0.005 to 0.5 atm.); then the multilayer glass ceramic substrate can be obtained.

The organic binder for shaping ceramic obtained from the present invention has the solvent composed of water alone or water and water soluble organic solvent. It makes it possible produce the ceramic green sheet featuring excellent ceramic dispersion, surface flatness, density, elongation, and strength, completely or almost without using the non-water soluble organic solvent or without having to use it. This provides a great advantage in meeting the low pollution and resource saving requirements. Furthermore, laminating and firing said green sheet provide the more dense multilayer ceramic substrate featuring excellent surface flatness and strength.

The organic binder for shaping ceramic according to the present invention is very effective as the organic binder for water system ceramic, and said organic binder for shaping ceramic exhibits its function for bondage among ceramic fine powders, to provide the characteristics of flexibility, shapability, dispersive power and surface properties required from the green sheet. It also provides characteristics such as lamination pressure bonding and mechanical strength required from the laminate of the green sheet provided with circuit patterns.

DESCRIPTION OF THE PREFERRED EMBODIMENTS

The following describes the preferred embodiments of the present invention; however, it should not be understood that the present invention is limited only to the following description.

Notice that symbol "%" appearing in the following description stands for "weight percentage."

The ceramic precursor composition was obtained by adding the 100 parts by weight of ceramic powder to 5 to 30 parts by weight of organic binder for shaping ceramic, and was kneaded by the ball mill. After making the ceramic precursor composition slurry, this slurry was degassed by pressure reduction. After adjustment of the viscosity of the uniform slurry mixture liquid prepared in this way, it was coated on the polyester film, using the doctor blade casting device. Then the film was dried and the green sheet was manufactured, and characteristics of the sheet were evaluated for shapability, flexibility and dispersive power.

Shapability

Shapability was evaluated by visual observation by coating the green sheet on the polyester film and drying it.

o: The green sheet can be removed smoothly from the polyester film without being cracked.

Δ: Green sheets were a little cracked.

x: Excessive cracks without forming green sheets

Flexibility

The center of the green sheet was held by each of five types of glass rods having different diameters, and a 180° C. bending test around that position was conducted. Flexibility was indicated by the rod diameters (mm) immediately before the sheet was cracked. Rod diameters used were 2, 3, 4, 6 and 8 mm.

Dispersive power o: Little secondary coagulation for dispersion of ceramic fine particles in the green sheet Δ: Slightly excessive secondary coagulation for dispersion of ceramic fine particles in the green sheet x: Much secondary coagulation for dispersion of ceramic fine particles in the green sheet

EXAMPLE 1

Synthesis of Organic Binder for Shaping Ceramic

There were added 742.7 g of ion-exchanged water and 28.5 g of polyethylene oxide (hereinafter referred to as "PEO", average molecular weight: 250,000 to 300,000) in the 2-liter flask provided with the agitator, thermometer, reflux condenser, dropping funnel and nitrogen gas feed tube downstream of the nitrogen gas, while being agitated, so that uniform dissolution would be ensured, and nitrogen gas exchange was conducted for 30 minutes. During agitation, 300 g of n-butyl methacrylate, 31.5 g of diisonyl phthalate (DINP) as plasticizer, and 9 g of water solution of ammonium persulfate of 5 wt % (solid concentration 0.45 g) as polymerization initiator were added to it, and the nitrogen gas was replaced for 30 minutes to 1 hour. It was heated at the polymerization temperature of 60° C. for 4 hours, and polymerization was further conducted at 80° C. for 2 hours, to complete the reaction. It was cooled down to the room temperature to get the organic binder for shaping ceramic having a solid concentration of 32% (polymer particle diameter: 3.0 microns (50% average particle diameter), suspension liquid viscosity: 7 Pa.s, average weight molecular weight : 500,000).

Green Sheet Production

There were mixed 100 parts by weight of the ceramic powder having the particle diameter of 5 microns or less composed of alumina powder as major component and the total composition being 91% $Al_2O_3$, 6% $SiO_2$ and 3% MgO, 40 parts by weight of the ion exchanged water, and 0.1 parts by weight of the ceramic dispersant aid A6114 (trade name of Toagosei Chemical Industry Co., Ltd. in Japan, solid content; 40%) and the mixture was kneaded in the ball mill using the vessel lined with alumina and alumina-made ball for two hours. Then, there was added 20 pars by weight of the organic binder for shaping ceramic, to get the ceramic precursor composition. This was kneaded in the ball mill using the vessel lined with alumina and alumina-made ball for 24 hours. After producing the ceramic precursor composition slurry, this slurry was degassed at the reduced pressure of 133.3 Pa to 6665 Pa (1 mm Hg to 50 mm Hg). The viscosity of uniform slurry mixture liquid prepared in this way was adjusted again under the reduced pressure by scattering water to be 3 Pa.s to 10 Pa.s., and the slurry was coated on the polyester film, using the doctor blade type casting device. Then it was dried to produce the 0.2 mm thick green sheet. The characteristics of the sheet were highly evaluated for shapability, flexibility and dispersive power.

Multilayer Ceramic Substrate Production

The resulting green sheet was cut off into the squares of 200 mm ×200 mm, using a punching die, and guide holes were drilled. After that, the green sheet was fixed using these guide holes, and through-holes having a diameter of 0.1 mm were punched at specified positions by the punching method. The conductor paste of tungsten powder having a particle diameter of 5 microns, cellulose nitrate, ethyl cellulose, alpha-terepineol=100:4:2:23 (by weight ratio) is coated on the through-holes on the green sheet, and specified circuit patterns were printed on the surface of the green sheet by screen printing. There are laminated 40 of these green sheets provided with circuit patterns printed with conductor according to the position of the guide hole, and they were hot pressed and pressure bonded at the temperature of 120° C. with the pressure of 9.80 MPa (100 kgf/cm$^2$). The resulting laminates were cut off into specified shapes to get 150 mm square green sheet alminates, which were fired at 1600° C. in the firing furnace having the atmosphere with the mixture of nitrogen, hydrogen and water vapor for 2 hours. During the firing process, binders were removed when the temperature was rising. Multilayer ceramic substrates having 120 mm square and 7 mm thickness were produced by this green sheet lamination method.

EXAMPLES 2 to 11

Table 1 illustrates the binder composition, amount to be used, and results of evaluating the green sheet characteristics with reference to said Example 1 and Examples 2 to 11.

Synthesis of Organic Binder for Shaping Ceramic

In Examples 2 to 4, the mixing ratio between component (A) and component (B) was determined so that, for 300 g of component (A), the PEOs as components (B) were 24 g, 21 g and 15 g in weight respectively, and the weight of ion-exchanged water was set to 733.1 g, 726.8 g and 718.0 g, respectively. In Examples 5 to 7, the type of the vinyl monomer as component (A) (at the fixed mixing ratio) and the type of the viscometric molecular weight and amount to be used of component (B) were changed; in Examples 8 to 11, the mixing ratio between water and water soluble solvent was changed. Except these, conditions were the same as those of Example 1, thereby gaining the organic binder for shaping ceramic having the solid concentration of 32 weight percent.

Green Sheet Production

The same conditions as those of Example 1 were used, except that the organic binder for shaping ceramic and its amount to be added were changed, and the green sheet was produced. Table 1 illustrates the characteristics of the green sheet.

The same experiment as that in Example 1 was conducted to produce a multilayer wiring ceramic substrate from the green sheet.

Embodiments 12 to 28

Table 2 shows the type of the component (A) which is the binder composition, the type of the plasticizer, the type of the polymerization initiator and its amount used, and various dispersants for polymerization of component (B), as well as the resultant valuation of the properties of the green sheet.

Organic Binder for Shaping Ceramic Synthesis

The organic binder for shaping ceramic having a solid content concentration of 32 weight percent was obtained under the same condition as those in Example 1, except that the type of component (A), the type of the plasticizer and its amount used, the type of the polymerization initiator, and the type of the water-soluble solvent and its amount used were changed as shown in Table 2.

Green Sheet Production

The 0.1 parts by weight of said A6114 and 40 parts by weight of ionexchanged water were added to 100 parts by weight of ceramic powder having a particle diameter of 5. micros or less comprising of the components of 65 vol % of borosilicate glasses ($SiO_2$: 79%, $B_2O_3$: 19% and $K_2O$: 2%), 15 vol % of alumina and 20 vol % of cordierite as glass ceramic. Then they were kneaded by the ball mill for two hours; then 10 to 30 parts by weight of the organic binders for shaping ceramic shown in Table 2 were added to them, thereby obtaining the ceramic precursor composition. This ceramic precursor composition was put to experiment in the same way as Example 1, and the green sheet was produced. Table 2 illustrates the properties thereof.

Multilayer Ceramic Substrate Production

The resulting green sheet was cut off into the squares of 200 mm ×200 mm, using a punching die, and guide holes were drilled. After that, the green sheet was fixed using these guide holes, and through-holes having a diameter of 0.1 mm were punched at specified positions by the punching method. The conductor paste comprising the 89 weight percent of copper powder having a particle diameter of 3 microns, and 11 weight percent of vehicle (solvent: 90 to 95 weight percent of n-butyl carbitol acetate, binder: ethyl cellulose, 5 to 10 weight percent) is filled into the green sheet provided with through holes. The specified circuit patterns were printed on the surface of the green sheet by screen printing. These fourty green sheets provided with circuit patterns printed with conductor are laminated according to the position of the guide hole, and were hot pressed and pressure bonded at the temperature of 120° C. with the pressure of 9.80 MPa (100 kgf/cm$^2$). The resulting laminates were cut off into specified shapes to get 150 mm square green sheet alminates, which were fired at 950° C. in the nitrogen atmosphere for 2 hours after binders had been removed at 350 to 850° C. under the nitrogen-hydrogen-water vapor atmosphere for 20 hours. During the firing process, binders were removed sufficiently when the temperature was rising. There were produced 120 mm square, 7 mm-thick multilayer ceramic substrates by this green sheet lamination method.

Reference Example 1

Binder Resin

The binder used was the denaturated PVA which was the polyvinyl acetate copolymer containing 0.4 mol percent of octyl acrylamide and 2.0 mol percent of trimethyl-3-(1-methacrylamide propyl) ammonium chloride, where 88.7 mol percent of the vinyl acetate component was saponified and 4 percent water solution viscosity at 20° C. was 34 centipoises.

Green Sheet Production

The 100 parts by weight of the ceramic powder having the particle diameter of 5 microns or less composed of alumina powder as major component and the total composition being 33% $Al_2O_3$, 33% $SiO_2$ and 43% borosilicate glasses, 6 parts of the said binder, one part of polyoxyethylene nonyl phenol as dispersant, and 50 parts of ion exchanged water were added to get the ceramic precursor composition. This was kneaded in the ball mill using the vessel lined with alumina and alumina-made ball for 24 hours. Experiment was then continued in the same way as Example 1, to get the green sheet. Table 4 illustrates the characteristics thereof.

Reference Example 2

Binder Resin

Using 20 g of monoethanolamine salt as a dispersant, for obtaining copolymer having the weight average molecular weight of about 100,000 comprising the acrylic acid, butyl acrylate and ethyl acrylate (at the weight ratio of 50 to 25 to 25) using 0.4 g of ammonium persulfate as polymerization initiator, ethyl acrylate is emulsified and polymerized in 80 g of mixed solvent of water and methanol at the ratio of 5 to 5 by weight, thereby obtaining latex of 50% solid content.

Green Sheet Production

Except that 24 parts of said latex and 18 parts of ion exchanged water were used, experiment was conducted in the same way as Reference Example 1 and the green sheet was produced. Table 4 illustrates the characteristics thereof.

Reference Example 3

Binder Resin

Using non-ionic surfactant as dispersant, the latex comprising butyl acrylate, acrylic acid and methacrylic acid (at the polymerization ratio of 70 to 15 to 15) as emulsifier was obtained.

Green Sheet Production

Except that 10 parts of said latex (solid contents) and 25 parts of monoethanolamine and ion exchanged water as neutralizer were used, experiment was conducted in the same way as Reference Example 1 and the green sheet was produced. Table 4 illustrates the characteristics thereof.

Reference Example 4

Binder Resin

The latex having the composition of 75 parts by weight of ethyl acrylate, 75 parts by weight of methyl methacrylate, and 4.5 parts by weight of N-methylol acryl acid amide was obtained, using 4 parts by weight of the glycine betaine chloride ester of the polyoxyethylene octyl phenyl ether and 4 parts by weight of dimethacylic acid ester of polyoxy propylene polyoxyethylene glycol as emulsifier, and using 2, 2'-azobis (N, N'-dimethylene isobutylamidine) hydrochloride as polymerization initiator.

Green Sheet Production

Except that 10 parts of said latex (solid contents), 3 parts of polyethylene glycol (molecular weight 200) as plasticizer, 2 parts of ethyl carbitol and 25 parts of ion exchanged water were used, experiment was conducted in the same way as Reference Example 1 and the green sheet was produced. Table 4 illustrates the characteristics thereof.

Reference Example 5

Binder Resin

The emulsion of hydrophobic high polymer water system dispersant/methacrylic acid ester (MMA/n-BMA/LMA/CHMA =10/60/10/20, solid content 48%) and 10% water soluble high polymer PVA (polymerization 500, saponification degree 88.5 mol percent) as component (A) were mixed at the weight ratio of 1 to 1 to get the organic binder for green sheet (composite binder).

Green Sheet Production

Experiment was conducted in the same way as Reference Example 1 and the green sheet was produced, except that 100 parts by weight of the ceramic powder having the particle diameter of 5 microns or less composed of alumina powder as major component and the total composition being 33% $Al_2O_3$, 33% $SiO_2$ and 43% borosilicate glasses, 16 parts by weight of said latex (solid content), 50 parts by weight of water, and 0.3 parts by weight of dispersant aid of ammonium salt polyacrylate were kneaded by the ball mill MAA: methyl acrylate HEMA: 2-hydroxyethyl methacrylate St: s tyrene EAA: ethyl acrylate EMA: ethyl methacrylate HEA: hydroxyethyl acrylate i-Bt: isobutylene i-BMA: isobutyl methacrylate BZMA: benzyl methacrylate MMA: methyl methacrylate HPMA: hydroxy propyl methacrylate α-St: α-methyl styrene MEAA: methoxy ethyl acrylate MAA: methyl acrylate LMA: lauryl methacrylate CHMA: cyclohexyl methacrylate PGM: propylene glycol monomethyl ether PGE: propylene glycol monomethyl ether ML: methyl lactate IPA: isopropyl alcohol AIBN: 2, 2'-azobis(isobutyronitrile)

APS: ammonium persulfate

KPS: potassium persulfate t-BHPO: tertiary butyl hydroperoxide

Then the organic binder obtained in Embodiments 1, 5, 8, 13, 14, 17, 18, 20, 23 and 26 and Reference Examples 1 to 5 was put into the platinum crucible and was incinerated in the 600° C. electric furnace under the nitrogen atmosphere for three hours to measure the weight. Five green sheets obtained in Embodiments 1, 5 and 8 were hot pressed and pressure bonded at 120° C. with the pressure of 100 kg f/cm²; the number of the sheets peeled at this time was checked by visual observation. Furthermore, it was fired at 1600° C. under the nitrogen-hydrogen-water vapor atmosphere for two hours to get the ceramic sheet. Five green sheets obtained in Examples 13, 14, 17, 18, 20, 23 and 26, and Reference Examples 1 to 5 were hot pressed and pressure bonded at 120° C. with the pressure of 100 kg f/cm² the number of the sheets peeled at this time was checked by visual observation. Furthermore, this laminates ware fired at 950° C. in the nitrogen atmosphere for 2 hours after binders had been removed at 350 to 850° C. in the nitrogen-hydrogen-water vapor atmosphere for 20 hours. The density of these sheets was measured and surface conditions were

TABLE 1

| | Component (A) | | Component (B) dispersant for polymerization (g) | | | | Polymerization | | Green sheet characteristics | | |
|---|---|---|---|---|---|---|---|---|---|---|---|
| Example | vinyl monomer (g) | | (molecular weight) | Plasticizer (g) | Solvent (g) | | initiator (g) | Binder (part) | Shapability | Flexibility (mm)* | Dispersive power |
| 1 | n-BMA 300 | | PEO 28.5 (300,000) | DINP 31.5 | Water 742.7 | | APS 0.45 | 20 | ○ | 2 | ○ |
| 2 | n-BMA 300 | | PEO 24 (300,000) | DINP 31.5 | Water 733.1 | | APS 0.45 | 20 | " | " | " |
| 3 | n-BMA 300 | | PEO 21 (300,000) | DINP 31.5 | Water 726.8 | | APS 0.45 | 20 | " | " | " |
| 4 | n-BMA 300 | | PEO 15 (300,000) | DINP 31.5 | Water 718.0 | | APS 0.45 | 20 | " | " | " |
| 5 | n-BMA 210 | n-BAA 90 | PEO 27 (250,000) | None | Water 694.9 | | AIBN 0.5 | 20 | " | " | " |
| 6 | n-BMA 210 | n-BAA 90 | PEO 21 (500,000) | None | Water 682.1 | | AIBN 0.5 | 20 | " | " | " |
| 7 | n-BMA 210 | n-BAA 90 | PEO 15 (800,000) | None | Water 984.4 | | AIBN 0.5 | 20 | " | " | " |
| 8 | n-BMA 210 | EMA 90 | PEO 21 (300,000) | DINP 50.7 | Water 394.9 | IPA 394.9 | KPS 0.5 | 9 | " | " | " |
| 9 | n-BMA 210 | EMA 90 | PEO 21 (300,000) | DINP 50.7 | Water 473.9 | IPA 315.9 | KPS 0.5 | 14 | " | " | " |
| 10 | n-BMA 210 | EMA 90 | PEO 21 (300,000) | DINP 50.7 | Water 552.9 | IPA 236.9 | KPS 0.5 | 16 | " | " | " |
| 11 | n-BMA 210 | EMA 90 | PEO 21 (300.000) | DIDP 50.7 | Water 631.9 | IPA 158.0 | KPS 0.5 | 20 | " | " | " |

*Used glass rod diameter

TABLE 2

| | Component (A) vinyl monomer (g) | | Component (B) dispersant for polymerization (g) (molecular weight) | Plasticizer (g) | Solvent (g) | | Polymerization initiator (g) | Green sheet characteristics | | | |
|---|---|---|---|---|---|---|---|---|---|---|---|
| Example | | | | | | | | Binder (part) | Shapability | Flexibility (mm)* | Dispersive power |
| 12 | n-BMA 210 | EMA 90 | PED 21 (300,000) | DINP 50.7 | Water 710.9 | IPA 79.0 | KPS 0.5 | 25 | ○ | 2 | ○ |
| 13 | i-BMA 270 | EMA 30 | PED 21 (300,000) | DOP 28.5 | Water 742.7 | | APS 0.45 | 20 | " | " | " |
| 14 | i-BMA 180 | n-BMA 120 | PEO 21 (300,000) | DOP 20.5 | Water 725.7 | | APS 0.45 | 15 | " | " | " |
| 15 | i-BMA 255 | n-BAA 45 | PED 21 (300,000) | DOP 16.1 | Water 703.4 | | APS 0.45 | 30 | " | " | " |

TABLE 2-continued

| | Binder | | | | | | | | | | | |
|---|---|---|---|---|---|---|---|---|---|---|---|---|
| | | | | Component (B) dispersant for polymerization | | | | | Polymeri- | | Green sheet characteristics | | |
| Example | Component (A) vinyl monomer (g) | | | | (g) (molecular weight) | Plasticizer (g) | Solvent (g) | | zation initiator (g) | Binder (part) | Shapability | Flexibility (mm)* | Dispersive power |
| 16 | i-BMA 228 | n-BAA 72 | | | PEO 21 (300,000) | DOP 10.0 | Water 347.4 | EGM 347.4 | APS 0.45 | 20 | " | " | " |
| 17 | n-BMA 210 | n-BAA 90 | | | PEO 21 (300,000) | DOP 6.0 | Water 694.9 | | APS 0.45 | 20 | " | " | " |
| 18 | n-BMA 210 | NEMA 90 | | | PEO 21 (1,000,000) | DOP 15.2 | Water 714.4 | | APS 0.45 | 5 | " | " | " |
| 19 | n-BMA 240 | HEMA 60 | | | PEO 21 (300,000) | DOP 13.9 | Water 711.7 | | APS 0.5 | 30 | " | " | " |
| 20 | n-BMA 150 | St 150 | | | PED 15 (1,100,000) | DIDP 17.4 | Water 706.4 | | AIBN 0.5 | 20 | " | " | " |
| 21 | MMA 150 | EAA 90 | HEMA 60 | | PED 21 (300,000) | DIDP 24.D | Water 513.2 | IPA 219.9 | AIBN 0.5 | 5 | " | " | " |
| 22 | EMA 15B | n-BAA 60 | HEA 75 | i-Bt 15 | PEtOZO 21 (500,000) | None | Water 477 | ML 205 | t-BNPO 0.5 | 15 | " | " | " |

*: Used glass rod diameter

TABLE 3

| | Binder | | | | | | | | | | | |
|---|---|---|---|---|---|---|---|---|---|---|---|---|
| | | | | Component (B) dispersant for polymerization | | | | | Polymeri- | | Green sheet characteristics | | |
| Example | Component (A) vinyl monomer (g) | | | | (g) (molecular weight) | Plasticizer (g) | Solvent (g) | | zation initiator (g) | Binder (part) | Shapability | Flexibility (mm)* | Dispersive power |
| 23 | EMA 120 | i-BMA 120 | BzMA 60 | | PEO 21 (300,000) | DHP 4D | Water 537.D | PGE 230.1 | BPO | 20 | ○ | 2 | ○ |
| 24 | n-BMA 210 | n-BAA 60 | MAA 30 | | PEtDZO 21 (500,000) | None | Water 767.125 | | APS 0.5 | 20 | " | " | " |
| 25 | MMA 210 | HEMA 45 | HPMA 45 | | PEO 18 (600,000) | DBP 43.5 | Water 537.7 | ML 230.5 | AIBH 0.5 | 20 | " | " | " |
| 26 | i-BMA 150 | α-St 90 | MEAA 60 | | PEO 18 (500,000) | DBP 9.4 | Water 695.7 | | APS 0.5 | 20 | " | " | " |
| 27 | EMA 150 | EAA 90 | HEAA 60 | | PEO 21 (300,000) | DHP 29.6 | Water 512.9 | IPA 219.5 | AIBH 0.5 | 20 | " | " | " |
| 28 | EMA 30 | MAA 60 | HEA 180 | i-Bt 30 | PEtOzD 21 (500,000) | None | Water 341.1 | PGM 341.1 | APS 0.5 | 20 | " | " | " |

TABLE 4

| | Binder composition | Binder (part) | Shapability | Flexibility (mm)* | Dispersive power |
|---|---|---|---|---|---|
| Reference Example 1 | Acetic vinyl copolymer containing 4 mol % Octyl acryl amide, and 2 mol % trimethyl-3-(1-methacrylamide propyl) ammonium chloride (saponification degree of acetic vinyl component 88.7%), solvent: water 3880 | 6 | x | 8 | Δ |
| Reference Example 2 | Emulsified polymer of ethyl acrylate, using monoethanol-amine salt of acrylic acid/ethyl acrylate/butyl acrylate (weight ratio: 50/25/25) as dispersant   Solvent Water MeOH  480  120 | 24 | x | 6 | Δ |
| Reference Example 3 | Emulsified polymer of acrylic acid/ethyl acrylate/butyl acrylate (weight ratio: 15/15/70), using nonionic surfactant as emulsifier | 10 | x | 6 | Δ |
| Reference Example 4 | 4 parts by weight of polyoxyethylene octyl phenyl ether glycine betaine ester chloride, 4 parts by weight of methacrylic acid ester of polyoxyethylene propylene polyocyl ethylene glycol, 75 parts by weight of ethyl acrylate, 75 parts by weight of ethyl methacrylate, 4.5 parts by weight of N-methyrolacrylamide | 10 | Δ | 6 | Δ |
| Reference Example 5 | (B) Water system dispersant of hydrophobic high polymer: emulsion of methacryl acid ester (MMA/n-BNA/LMA/CHMA = 10/60/10/20) (solid content 48%), (A) 10% water soluble high polymer PVA (polymerization 500, saponification degree 86.5 mol %) (B)/(A) = 1/1 | 5 | Δ | 6 | Δ |

*Used glass rod diameter

TABLE 5

| Example | Binder ash (%/solid) | Hot pressing and pressure bonding (number of peels) | Density (g/cm$^3$) | Surface conditions |
|---|---|---|---|---|
| 1 | 0.0007 | 0 | 3.13 | Good |
| 5 | 0.0075 | 0 | 3.12 | " |
| 8 | 0.0005 | 0 | 2.69 | " |
| 13 | 0.0007 | 0 | 2.63 | " |
| 14 | 0.0011 | 0 | 2.68 | " |
| 17 | 0.0064 | 0 | 2.67 | " |
| 18 | 0.0045 | 0 | 2.68 | " |
| 20 | 0.0162 | 0 | 2.69 | " |
| 23 | 0.0071 | 0 | 2.67 | " |
| 26 | 0.0221 | 0 | 2.68 | " |
| Reference Example 1 | 2.5664 | 2 | 2.32 | Rough |
| Reference Example 2 | 1.7230 | 2 | 2.55 | Rough |
| Reference Example 3 | 3.2410 | 5 | — | Split |
| Reference Example 4 | 0.9451 | 5 | 2.52 | Cracked |
| Reference Example 5 | 3.1251 | 5 | — | Split |

What is claimed is:

1. A multilayer ceramic substrate comprising at least one ceramic layer made by laminating at least one ceramic green sheet layer and conductor layers formed on surfaces of said at least one ceramic green sheet layer into laminates and by sintering the resulting laminates, wherein each ceramic green sheet layer comprises a ceramic precursor composition comprising (I) 100 parts by weight of ceramic fine powder having an average particle diameter of 10 microns or less as component (C) and (II) 5 to 30 parts by weight, based on 100 parts by weight of the ceramic fine powder, of an organic binder for bonding the ceramic fine powder, wherein said organic binder comprises:

(i) 100 parts by weight of a water insoluble polymer of at least one vinyl monomer as a major component of the organic binder, as component (A), and (ii) 1 to 9.5 parts by weight, based on 100 parts by weight of said component (A), of water soluble polymer, as component (B);

particles of said component (A) being dispersed by said component (B) in an aqueous medium resulting from suspension polymerization of said at least one vinyl monomer in water containing said water soluble polymer as a dispersion stabilizer, wherein the water soluble polymer as component (B) comprises polyethylene oxide having an average viscometric molecular weight of 100,000 to 1,000,000.

2. A multilayer ceramic substrate comprising at least one ceramic layer made by laminating at least one ceramic green sheet layer and conductor layers formed on surfaces of said at least one ceramic green sheet layer into laminates and by sintering the resulting laminates, wherein each ceramic green sheet layer comprises a ceramic precursor composition comprising (I) 100 parts by weight of ceramic fine powder having an average particle diameter of 10 microns or less as component (C) and (II) 5 to 30 parts by weight, based on 100 parts by weight of the ceramic fine powder, of an organic binder for bonding the ceramic fine powder, wherein said organic binder comprises:
- (i) 100 parts by weight of a water insoluble polymer of at least one vinyl monomer as a major component of the organic binder, as component (A), and
- (ii) 1 to 9.5 parts by weight, based on 100 parts by weight of said component (A), of water soluble polymer, as component (B);

particles of said component (A) being dispersed by said component (B) in an aqueous medium resulting from suspension polymerization of said at least one vinyl monomer in water containing said water soluble polymer as a dispersion stabilizer, wherein the water soluble polymer as component (B) is poly(2-ethyloxazoline).

3. A multilayer ceramic substrate comprising at least one ceramic layer made by laminating at least one ceramic green sheet layer and conductor layers formed on surfaces of said at least one ceramic green sheet layer into laminates and by sintering the resulting laminates, wherein each ceramic green sheet layer comprises a ceramic precursor composition comprising (I) 100 parts by weight of ceramic fine powder having an average particle diameter of 10 microns or less as component (C) and (II) 5 to 30 parts by weight, based on 100 parts by weight of the ceramic fine powder, of an organic binder for bonding the ceramic fine powder, wherein said organic binder comprises:
- (i) 100 parts by weight of a water insoluble polymer of at least one vinyl monomer as a major component of the organic binder, as component (A), and
- (ii) 1 to 9.5 parts by weight, based on 100 parts by weight of said component (A), of water soluble polymer, as component (B);

particles of said component (A) being dispersed by said component (B) in an aqueous medium resulting from suspension polymerization of said at least one vinyl monomer in water containing said water soluble polymer as a dispersion stabilizer, wherein the component (A) comprises a polymer of n-butyl methacrylate and the water soluble polymer as component (B) comprises polyethylene oxide.

4. A multilayer ceramic substrate comprising at least one ceramic layer made by laminating at least one ceramic green sheet layer and conductor layers formed on surfaces of said at least one ceramic green sheet layer into laminates and by sintering the resulting laminates, wherein each ceramic green sheet layer comprises a ceramic precursor composition comprising (I) 100 parts by weight of ceramic fine powder having an average particle diameter of 10 microns or less as component (C) and (II) 5 to 30 parts by weight, based on 100 parts by weight of the ceramic fine powder, of an organic binder for bonding the ceramic fine powder, wherein said organic binder comprises:
- (i) 100 parts by weight of a water insoluble polymer of at least one vinyl monomer as a major component of the organic binder, as component (A), and
- (ii) 1 to 9.5 parts by weight, based on 100 parts by weight of said component (A), of water soluble polymer, as component (B);

particles of said component (A) being dispersed by said component (B) in an aqueous medium resulting from suspension polymerization of said at least one vinyl monomer in water containing said water soluble polymer as a dispersion stabilizer, wherein the water soluble polymer as component (B) comprises polyethylene oxide having a weight average molecular weight of 200,000 to 1,000,000.

* * * * *